(12) United States Patent
Cope et al.

(10) Patent No.: US 10,361,719 B2
(45) Date of Patent: Jul. 23, 2019

(54) METHOD OF MANAGING DATA CAPTURED IN AN AERIAL CAMERA SYSTEM

(71) Applicant: Spookfish Innovations Pty Ltd, Bentley, Western Australia (AU)

(72) Inventors: Simon Cope, Burswood (AU); Michael Von Bertouch, Bicton (AU)

(73) Assignee: Spookfish Innovations Pty Ltd., Bicton (AU)

( * ) Notice: Subject to any disclaimer, the term of this patent is extended or adjusted under 35 U.S.C. 154(b) by 0 days.

(21) Appl. No.: 15/448,113

(22) Filed: Mar. 2, 2017

(65) Prior Publication Data
US 2017/0257115 A1 Sep. 7, 2017

(30) Foreign Application Priority Data
Mar. 2, 2016 (AU) ................................ 2016900789

(51) Int. Cl.
| | | |
|---|---|---|
| G11B 5/09 | (2006.01) |
| H03M 13/11 | (2006.01) |
| B64D 47/08 | (2006.01) |
| F16F 15/04 | (2006.01) |
| F16M 13/02 | (2006.01) |
| G11B 5/008 | (2006.01) |
| G11B 33/08 | (2006.01) |

(Continued)

(52) U.S. Cl.
CPC .............. *H03M 13/11* (2013.01); *B64D 47/08* (2013.01); *F16F 15/04* (2013.01); *F16M 13/02* (2013.01); *G11B 5/00813* (2013.01);

*G11B 33/08* (2013.01); *G11B 33/128* (2013.01); *H03M 13/611* (2013.01)

(58) Field of Classification Search
None
See application file for complete search history.

(56) References Cited

U.S. PATENT DOCUMENTS

| | | | | |
|---|---|---|---|---|
| 3,615,389 A | * | 10/1971 | Newberry ........... C04B 35/4682 347/113 |
| 4,180,458 A | * | 12/1979 | Shahan ................ B07B 1/284 209/326 |

(Continued)

FOREIGN PATENT DOCUMENTS

GB 2174210 A 10/1986

OTHER PUBLICATIONS

'Chapter 4—Remote Sensing As a Data Source', [retrieved from internet on Jan. 30, 2017] <URL: http://www.fao.org/docrep/003/T0446E/T0446E04.htm> published on Dec. 14, 2007 as per Wayback Machine.

(Continued)

*Primary Examiner* — Peter Vincent Agustin
(74) *Attorney, Agent, or Firm* — Dunlap Codding, P.C.

(57) ABSTRACT

A method of managing data captured in an aerial camera system is disclosed. The method comprises commencing an aerial survey so as to produce aerial survey data, storing the aerial survey data on the survey aircraft directly on at least one magnetic tape cartridge, completing the aerial survey, sending the at least one magnetic tape cartridge to a data processing facility, and retrieving the aerial survey data from the at least one magnetic tape cartridge at the data processing facility. A corresponding system is also disclosed.

21 Claims, 4 Drawing Sheets

(51) Int. Cl.
*G11B 33/12* (2006.01)
*H03M 13/00* (2006.01)

(56) References Cited

U.S. PATENT DOCUMENTS

| | | | | |
|---|---|---|---|---|
| 4,380,024 | A * | 4/1983 | Olofsson | G02B 27/01 348/115 |
| 5,283,643 | A * | 2/1994 | Fujimoto | B64D 45/00 340/973 |
| 5,517,419 | A | 5/1996 | Lanckton et al. | |
| 7,634,334 | B2 * | 12/2009 | Monroe | B64D 45/0015 369/21 |
| 8,942,938 | B2 * | 1/2015 | Bishop | G01R 13/02 702/67 |
| 2002/0035416 | A1 * | 3/2002 | De Leon | G07C 5/008 701/14 |
| 2003/0152145 | A1 * | 8/2003 | Kawakita | H04N 5/77 375/240.12 |
| 2004/0039497 | A1 * | 2/2004 | Wood | G06Q 10/06 701/4 |
| 2008/0284643 | A1 * | 11/2008 | Scherzinger | G01C 21/005 342/357.31 |
| 2009/0256909 | A1 * | 10/2009 | Nixon | B64D 47/08 348/144 |
| 2010/0013927 | A1 * | 1/2010 | Nixon | G01C 11/06 348/144 |
| 2011/0248123 | A1 * | 10/2011 | Abershitz | B64C 39/024 244/4 R |
| 2013/0003213 | A1 * | 1/2013 | Kabelac | G11B 27/107 360/49 |
| 2014/0146173 | A1 * | 5/2014 | Joyce | G01C 11/04 348/144 |
| 2014/0222249 | A1 * | 8/2014 | Freeman | B64C 39/024 701/2 |
| 2014/0320650 | A1 * | 10/2014 | Hong | H04N 7/185 348/144 |
| 2016/0217036 | A1 * | 7/2016 | Trachy | G06F 11/1076 |
| 2017/0257115 | A1 * | 9/2017 | Cope | B64D 47/08 |

OTHER PUBLICATIONS

Coughlin, T., 'Keeping Data for a Long Time', [retrieved from internet on Jan. 24, 2017] <URL: http://www.forbes.com/sites/tomcoughlin/2014/06/29/keeping-data-for-a-long-time/#7839810c5fab > published on Jul. 6, 2014 as per Wayback Machine.

Livens, J., 'Magnetic Tape to the Rescue—Six Benefits of LTO', [retrieved from internet on Jan. 24, 2017] <URL: http://blogs.ironmountain.com/2013/service-lines/data-backup-and-recovery/magnetic-tape-to-the-rescue-six-benefits-of-lto/ > published on Aug. 23, 2014 as per Wayback Machine.

International-type search report dated Jan. 31, 2017 for Australian Application No. 2016900789 filed on Mar. 2, 2016.

* cited by examiner

METHOD OF MANAGING DATA CAPTURED IN AN AERIAL CAMERA SYSTEM

FIELD OF THE INVENTION

The present invention relates to a method of managing data captured in an aerial camera system.

BACKGROUND OF THE INVENTION

Aerial camera systems are capable of producing large amounts of data during a typical sortie of a survey aircraft, and the data produced is required to be stored on the aircraft until completion of the sortie. In an existing system, the produced survey data is stored on the aircraft using a high-capacity removable flash storage array, and after completion of the sortie the flash storage arrays on which the survey data is stored are sent to a data processing facility for processing.

However, this type of data storage array is relatively expensive and has limited storage capacity, typically of the order of 1.7 TiB, to the extent that multiple data storage arrays are often required in order to carry out an aerial survey. In addition, one such existing data storage array contains 28 flash devices, which creates additional points of failure, potentially leading to data loss, and for this reason dual data storage arrays are often used for redundancy.

Existing data storage arrays are also relatively heavy (about 15 kg) and relatively bulky, resulting in increased handling and shipping charges when the survey aircraft operates remotely from the data processing facility. Operation at a remote location also requires many data storage arrays to be in circulation between the data processing facility and the survey aircraft, and this creates additional costs and operational issues, such as needing to know precisely ahead of time where the aircraft will be in order to ship storage units to the aircraft.

For these reasons, an arrangement has been used wherein a ground station at the remote location is used to retrieve the data from the storage arrays and transfer the data to a more compact lower cost storage medium, such as USB HDD or magnetic tape, and the low cost storage media are then sent to the processing facility.

However, significant additional time is required to transfer the data from the storage arrays to the low cost storage media, and therefore the time taken to ultimately deliver the data to the processing facility is significant, particularly as it is unlikely the data can be transferred to the low cost storage media post-flight in time to make an evening courier pickup.

The time required to transfer the data from the storage arrays to the low cost storage media also causes aircraft movement logistics to be significantly more difficult.

SUMMARY OF THE INVENTION

In accordance with a first aspect of the present invention, there is provided method of managing data captured in an aerial camera system, the method comprising:
  commencing an aerial survey so as to produce aerial survey data;
  storing the aerial survey data on the survey aircraft directly on at least one magnetic tape cartridge;
  completing the aerial survey;
  sending the at least one magnetic tape cartridge to a data processing facility; and
  retrieving the aerial survey data from the at least one magnetic tape cartridge at the data processing facility.

In an embodiment, the at least one magnetic tape cartridge comprises a LTO type cartridge.

In an embodiment, after the survey data is retrieved from the at least one magnetic tape cartridge at the data storage facility, the at least one magnetic tape cartridge is used as archive storage, thereby eliminating the need to duplicate data back onto archive storage.

In an embodiment, a plurality of tape drives are disposed in the survey aircraft, the plurality of tape drives for receiving a corresponding plurality of tape cartridges.

In an embodiment, one or more of the tape drives may be used to store Parity data, to provide for error correction in the event one or more tapes are unreadable.

In an embodiment, the tape cartridges on which the aerial survey data is directly stored have not previously been used to store aerial survey data.

In an embodiment, the method comprises mounting at least one tape drive relative to the survey aircraft so as to restrict transfer during use of vibrations experienced by the survey aircraft to the at least one tape drive.

In an embodiment, the method comprises mounting at least one tape drive relative to the survey aircraft using a resilient mounting arrangement, the configuration of the resilient mounting arrangement and/or the mounting location of the resilient mounting arrangement selected so as to define a desired fundamental frequency. The desired fundamental frequency may be in a frequency range of about 3 Hz to about 10 Hz.

In an embodiment, the resilient mounting arrangement includes a plurality of resilient isolators, and the method includes mounting the at least one tape drive relative to the survey aircraft using a resilient isolator disposed adjacent each corner of the tape drive.

At least one resilient isolator may be mounted relative to a rack frame using at least one mounting insert engaged with an aperture in the rack frame.

In an embodiment, at least one resilient isolator includes a wire rope isolator arranged to effect damping by Coulomb damping.

In an embodiment, the method comprises housing a tape drive in a rack frame and mounting the rack frame relative to the survey aircraft using the resilient mounting arrangement.

In an embodiment, the resilient mounting arrangement includes a common mounting rail, and the method comprises mounting at least 2 resilient isolators on the common mounting rail and connecting the common mounting rail to the rack frame.

Also disclosed is a system for managing data captured in an aerial camera system, the system comprising:
  at least one tape drive disposed on a survey aircraft, each tape drive arranged to store aerial survey data on the survey aircraft on at least one magnetic tape cartridge; and
  a resilient mounting arrangement, the at least one tape drive mounted relative to the survey aircraft using the resilient mounting arrangement, the configuration of the resilient mounting arrangement and/or the mounting location of the resilient mounting arrangement selected so as to define a desired fundamental frequency.

BRIEF DESCRIPTION OF THE DRAWINGS

The present invention will now be described, by way of example only, with reference to the accompanying drawings, in which.

DESCRIPTION OF AN EMBODIMENT OF THE INVENTION

Figure 1:
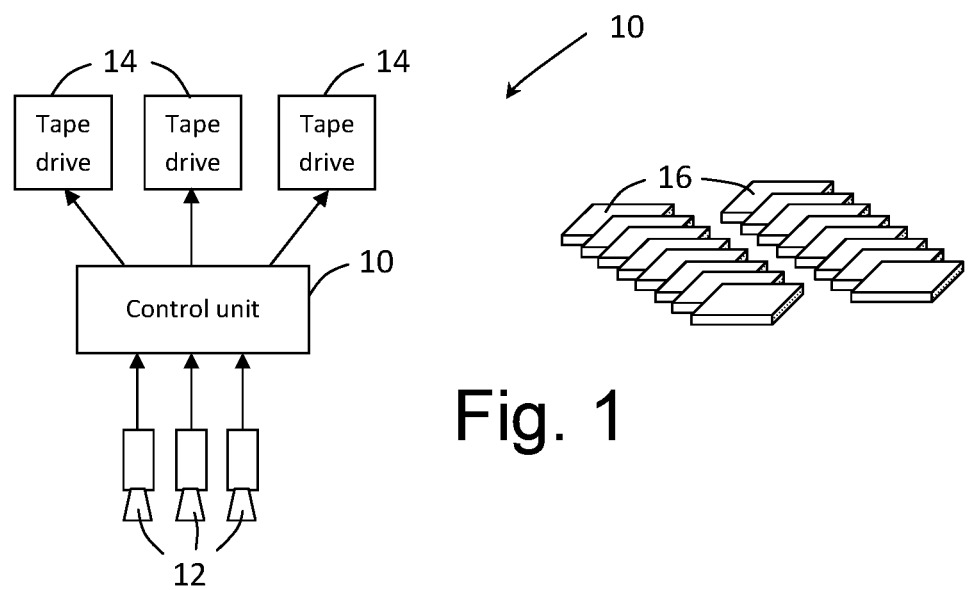
FIG. 1 is a diagrammatic representation of a system for managing data captured in an aerial camera system.
Figure 2:
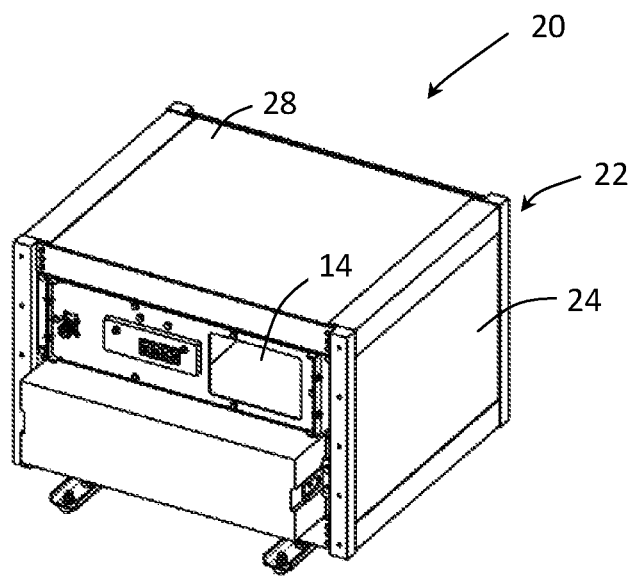
FIG. 2 is a diagrammatic representation of a rack assembly of the system for managing data shown in FIG. 1.
Figure 3:
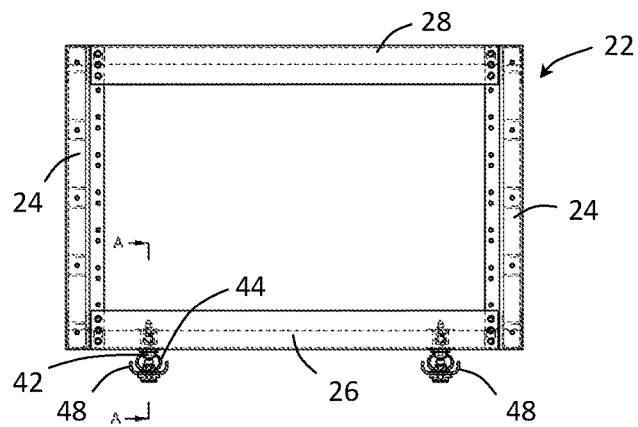
FIG. 3 is a diagrammatic front view of a frame of the rack assembly shown in FIG. 2.

Referring to the drawings, FIG. 1 shows a system 10 for managing data captured by an aerial camera system.

The aerial camera system 10 is disposed on a survey aircraft (not shown) and in this example includes several cameras 12 arranged to capture ground images as the survey aircraft moves. Capturing of image data by the cameras 12 is controlled and coordinated using a control unit 12 that manages the image capturing process, for example the timing of image capture, image error compensation and supply of image data to a tape drive 14 arranged to store the image data on a removable tape cartridge 16.

In the present example, the camera system 10 is capable of producing approximately 1 TiB of compressed image data per hour (13 TiB uncompressed), and will operate up to 200 days per year. Therefore, for a typical 6 hour sortie, 6 TiB of data would be produced. With this amount of data, a traditional aerial camera system that uses 1.7 TiB data storage arrays would require 4 such arrays in order to capture data for 6 hours, and 8 such arrays if a dual arrangement for redundancy is used. This number of storage arrays would present significant operational and cost challenges to the extent that using a traditional approach is not practical.

In this example, 3 tape drives 14 are used and during use each tape drive 14 receives a removable tape cartridge 16. The tape drives in this example are LTO6 magnetic tape data storage drives that are arranged to receive and read LTO6 cartridges. Each LTO6 cartridge has a capacity of 2.5 TiB.

In the present example, 3 tape drives are used since a sortie is typically 6 hours, each LTO6 tape holds up to 2.5 TiB and the aerial cameral system produces 1 TiB of data each hour.

In an alternative arrangement, the camera system is capable of producing approximately 5 TiB of compressed image data per hour, and with this arrangement 9-12 LTO6 tape drives would be used.

However, it will be understood that any suitable removable tape cartridge and any suitable number of tape cartridges are envisaged, the important aspect being that each tape cartridge receives and stores data on the tape cartridge directly during an aerial survey, and a suitable capacity and sufficient number of tape cartridges are used to capture the amount of data expected to be produced during a sortie.

It will be understood that tape cartridges have significant benefits, including high storage capacity (2.5 TiB in LTO6, 6.0 TiB in LTO7); ruggedness; they are inexpensive, and as a consequence can practically be used once in an aircraft and subsequently used as archive storage; they can operate at high pressure altitudes (13,000') in high vibration environments; and they have high data read/write speeds (~160 MiB/s for LTO6) per tape drive.

LTO type tape cartridges also include RFID tags that facilitate asset tracking, and LTO is type tape drives are capable of encrypting the data as the data is stored on a tape cartridge.

While tape drives are relatively rugged, operation of the tape drives can be affected by vibrations typically experienced in a survey aircraft during use. In order to reduce the effects of such vibrations, the tape drives 14 are mounted in one or more rack assemblies configured so as to reduce the amount of vibrations of the tape drives during use.

A suitable rack assembly 20 is shown in FIGS. 2 to 6. The rack assembly includes a frame 22, shown more particularly in FIGS. 3 and 4, arranged to accommodate one or more tape drives 14, and optionally other functional components of the aerial camera system that require protection from vibrations during a survey. The frame 22 includes 4 connected walls 24, a bottom panel 26 and a top panel 28.

Figure 6:
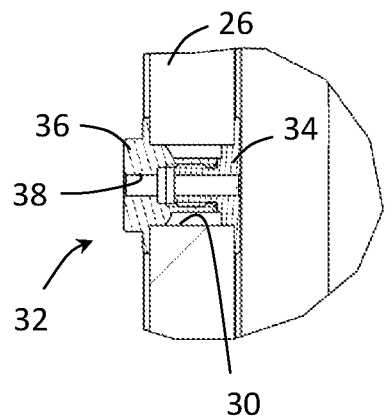
FIG. 6 is a diagrammatic enlarged cross sectional view of a mounting insert of the rack assembly shown in FIG. 2.

Extending through apertures 30 in the bottom panel 26 are mounting inserts 32, shown more particularly in FIG. 6. Each mounting insert 32 includes a plug portion 34 and a sleeve portion 36 that engage with and are bonded to each other. The connected plug portion 34 and sleeve portion 36 define an attachment through hole 38 that provides a secure attachment point.

The frame 22 is mounted to a suitable structure on the survey aircraft using a resilient mounting arrangement that includes a plurality of resilient isolators 40 arranged to perform a damping function and thereby reduce problematic vibrations that are transferred to the frame 22 and thereby the tape drives 14 mounted in the frame during a survey. Each resilient isolator 40 is attached to an adjacent pair of mounting inserts 32. In this example, each resilient isolator 40 includes 2 spaced plates 42 connected together by wire rope 44. Such a wire rope isolator 40 performs a damping function by Coulomb damping that is inherent in the isolator due to friction between individual strands in the wire rope when the wire rope deforms.

In this example, the isolators 40 are mounted to the mounting inserts 32 using first bolts 46 and to a common mounting rail 48 using second bolts 50. The common rail is mounted to a suitable structure on the survey aircraft (not shown) using aircraft mounting apertures 52.

Figure 4:
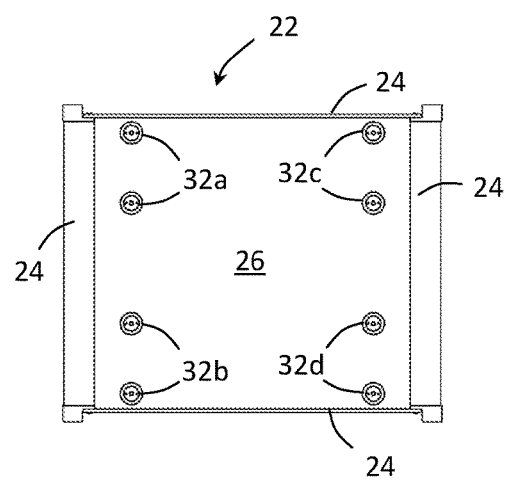
FIG. 4 is a diagrammatic bottom view of the frame shown in FIG. 3.
Figure 5:
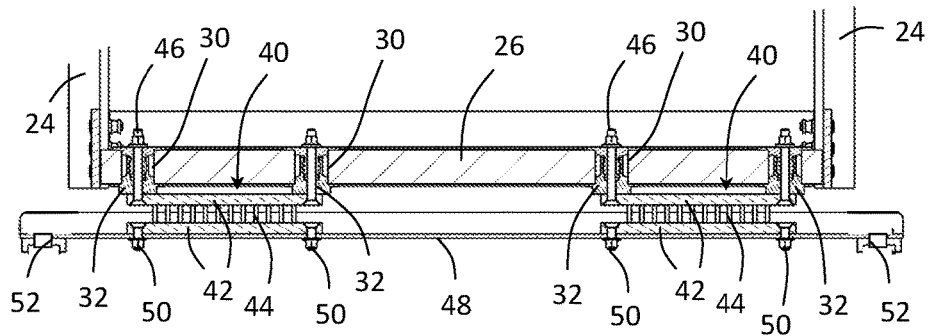
FIG. 5 is a diagrammatic cross sectional view taken along the line A-A in FIG. 3 in the direction of the arrows.

In this example, 4 resilient isolators 40 are used to mount the frame 22 to the survey aircraft and therefore 4 pairs of mounting inserts 32a, 32b, 32c and 32d are provided, as shown in FIG. 4.

As shown, each of the 4 resilient isolators 40 is disposed adjacent a corner of the bottom panel 26 so as to effectively damp motion in all three linear and rotational directions.

The resilient isolators 40 and the mounting locations of the resilient isolators 40 relative to the bottom panel 26 are selected such that the rotational and translational fundamental frequencies of the resilient mounting arrangement are in a range between about 3 Hz and 10 Hz. This range is chosen because in the survey aircraft during use there is minimal noise in the 3 Hz to 10 Hz frequency range, and as a consequence less vibrations are transferred to the mounting arrangement in this frequency range. It will be understood that by modifying the stiffness of the resilient isolators 40 and the mounting locations of the resilient isolators 40 defined by the locations of the mounting inserts 32, the fundamental frequency of the mounting arrangement can be optimised.

Figure 7:
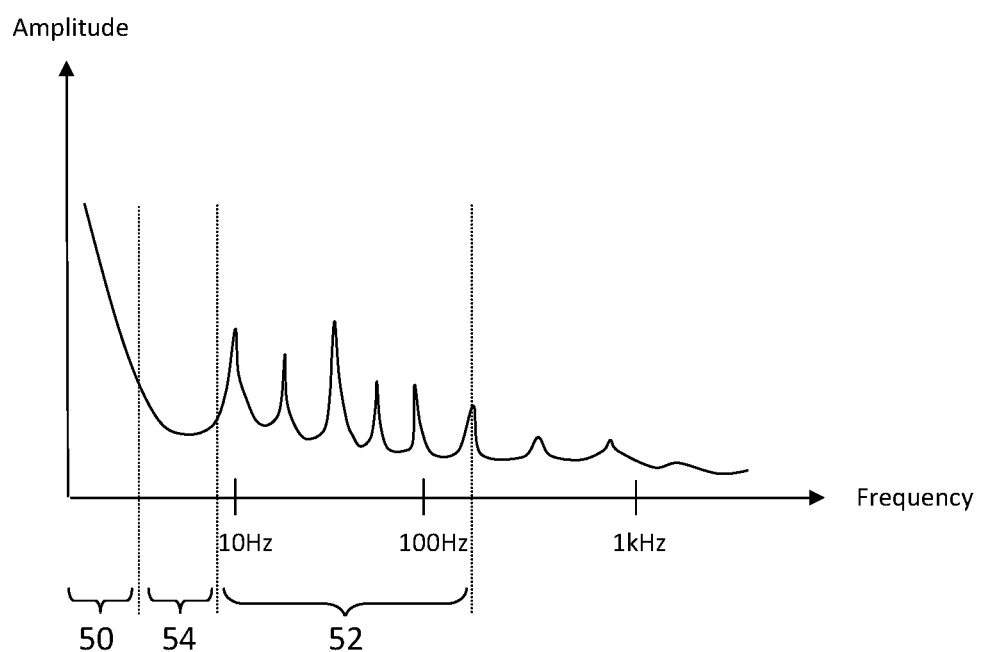
FIG. 7 illustrates typical vibration response characteristics in a survey aircraft.

Referring to FIG. 7, typical vibration response characteristics in a survey aircraft are shown.

As shown, at relatively low frequencies in a first frequency range 50 less than about 3 Hz, a typical survey aircraft is subjected to gust environment air turbulence that can cause significant translations of the aircraft in all 3 axes of movement and rotations of the aircraft about all 3 rotational axes. In a higher second frequency 52 range between about 10 Hz and about 100 Hz, significant excitation modes relating to the structure to which the rack is mounted typically exist, and vibrations in this frequency range are particularly problematic to operation of the tape drives 14. In a third frequency range 54 between about 3 Hz and 10 Hz, the frequency response is low, and consequently the mounting arrangement is tuned to this frequency range by appropriate configuration of the resilient isolators 40 and selection of the mounting locations of the resilient isolators 40.

Figure 8:
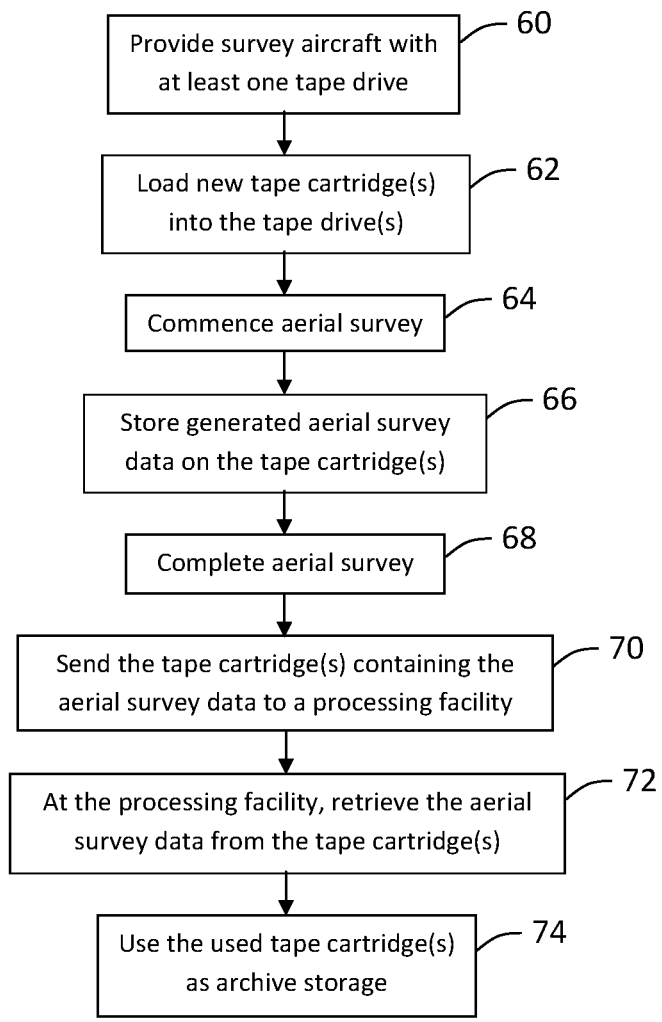
FIG. 8 is a flow diagram illustrating a method of managing data captured in an aerial camera system.

Referring to FIG. 8, a flow diagram illustrating steps 60 to 74 of a method of is managing data captured in an aerial camera system is shown.

As indicated at step 60, a survey aircraft is provided with a sufficient number of tape drives to enable the required amount of survey data to be stored during a sortie, in this example without the need for a person to exchange tape cartridges during the sortie, and new tape cartridges are loaded 62 into the tape drives.

In this example, the aerial camera system is of a type wherein 1 TiB of compressed image data is produced per hour and a sortie is expected to be 6 hours long, and therefore 3 tape drives 14 are provided with each tape drive 14 loaded with a new tape cartridge 16.

The aerial survey is then commenced 64 and during the survey aerial survey data generated by the aerial camera system 10 is stored on the tape cartridges 16, as indicated at step 66. After the aerial survey completes 68, the tape cartridges 16 are removed from the tape drives 14 and sent 70 to a data processing facility in any suitable way. It will be appreciated that since the tape cartridges are used only once and do not need to be returned to the aircraft for repeated use, there is no time restriction on the survey aircraft, and therefore no negative effect on aircraft movement logistics.

On receipt of the tape cartridges 16 at the data processing facility, the aerial survey data is retrieved 72 from the tape cartridges 16 and processed as required. The tape cartridges 16 are then used as archive storage, as indicated at step 74.

It will be appreciated that since the tape cartridges are inexpensive, it is possible to use only new blank tapes on the survey aircraft, and transfer of survey data to the data processing facility can be decoupled from the survey data capture process carried out by the survey aircraft, which among other things provides greater operational flexibility.

Modifications and variations as would be apparent to a skilled addressee are deemed to be within the scope of the present invention.

The invention claimed is:

1. A method of managing data captured in an aerial camera system, the method comprising:
    mounting at least one tape drive relative to a survey aircraft using a resilient mounting arrangement, the configuration of the resilient mounting arrangement and/or the mounting location of the resilient mounting arrangement selected so as to define a desired fundamental frequency;
    disposing a plurality of tape drives in the survey aircraft, the plurality of tape drives for receiving a corresponding plurality of tape cartridges;
    commencing an aerial survey so as to produce aerial survey data;
    storing the aerial survey data on the survey aircraft directly on at least one magnetic tape cartridge;
    completing the aerial survey;
    sending the at least one magnetic tape cartridge to a data processing facility; and
    retrieving the aerial survey data from the at least one magnetic tape cartridge at the data processing facility.

2. A method as claimed in claim 1, wherein the at least one magnetic tape cartridge comprises a LTO type cartridge.

3. A method as claimed in claim 1, comprising using the at least one magnetic tape cartridge as archive storage after the survey data is retrieved from the at least one magnetic tape cartridge at the data storage facility, thereby eliminating the need to duplicate data back onto archive storage.

4. A method as claimed in claim 1, comprising using one or more of the tape drives to store Parity data, the Parity data providing for error correction should one or more magnetic tape cartridges become unreadable.

5. A method as claimed in claim 1, wherein the magnetic tape cartridges on which the aerial survey data is directly stored have not previously been used to store aerial survey data.

6. A method as claimed in claim 1, wherein the desired fundamental frequency is in a frequency range of about 3 Hz to about 10 Hz.

7. A method as claimed in claim 1, wherein the resilient mounting arrangement includes a plurality of resilient isolators, and the method includes mounting the at least one tape drive relative to the survey aircraft using a resilient isolator disposed adjacent each corner of the tape drive.

8. A method as claimed in claim 7, comprising mounting at least one resilient isolator relative to a rack frame using at least one mounting insert engaged with an aperture in the rack frame.

9. A method as claimed in claim 7, wherein at least one resilient isolator includes a wire rope isolator arranged to effect damping by Coulomb damping.

10. A method as claimed in claim 1, comprising housing a tape drive in a rack frame and mounting the rack frame relative to the survey aircraft using the resilient mounting arrangement.

11. A method as claimed in claim 10, wherein the resilient mounting arrangement includes a common mounting rail, and the method comprises mounting at least 2 resilient isolators on the common mounting rail and connecting the common mounting rail to the rack frame.

12. A system for managing data captured in an aerial camera system, the system comprising:
    at least one tape drive disposed on a survey aircraft, each tape drive arranged to store aerial survey data on the survey aircraft on at least one magnetic tape cartridge; and
    a resilient mounting arrangement, the at least one tape drive mounted relative to the survey aircraft using the resilient mounting arrangement, the configuration of the resilient mounting arrangement and/or the mounting location of the resilient mounting arrangement selected so as to define a desired fundamental frequency.

13. A system as claimed in claim 12, wherein the at least one magnetic tape cartridge comprises a LTO type cartridge.

14. A system as claimed in claim 12, comprising a plurality of tape drives disposed in the survey aircraft, the plurality of tape drives for receiving a corresponding plurality of tape cartridges.

15. A system as claimed in claim 14, wherein at least one of the tape drives is arranged to store Parity data, the Parity data providing for error correction should one or more magnetic tape cartridges become unreadable.

16. A system as claimed in claim 12, wherein the desired fundamental frequency is in a frequency range of about 3 Hz to about 10 Hz.

17. A system as claimed in claim 12, wherein the resilient mounting arrangement includes a plurality of resilient isolators.

18. A system as claimed in claim 17, wherein the resilient isolators are disposed adjacent corners of the tape drive.

19. A system as claimed in claim 17, wherein the resilient isolators are mounted on a rack frame using at least one mounting insert engaged with an aperture in the rack frame, the rack frame arranged to house at least one tape drive.

20. A system as claimed in claim 17, wherein at least one resilient isolator includes a wire rope isolator arranged to effect damping by Coulomb damping.

21. A system as claimed in claim 19, wherein the resilient mounting arrangement includes a common mounting rail, at least 2 resilient isolators mounted on the common mounting rail and the common mounting rail connected to the rack frame.

* * * * *

UNITED STATES PATENT AND TRADEMARK OFFICE
CERTIFICATE OF CORRECTION

PATENT NO. : 10,361,719 B2
APPLICATION NO. : 15/448113
DATED : July 23, 2019
INVENTOR(S) : Simon Cope and Michael Von Bertouch It is certified that error appears in the above-identified patent and that said Letters Patent is hereby corrected as shown below:

In the Specification

Column 4, Line 6: After "LTO" delete "is"

Column 5, Line 20: After "method of" delete "is"

Signed and Sealed this
Third Day of September, 2019

Andrei Iancu
*Director of the United States Patent and Trademark Office*